(12) United States Patent
Mizumoto et al.

(10) Patent No.: US 6,393,299 B1
(45) Date of Patent: May 21, 2002

(54) RADIO COMMUNICATION EQUIPMENT

(75) Inventors: Toru Mizumoto, Hino; Hiroaki Shimizu, Hachioji; Tatsuya Tokunaga, Hino; Kenichi Torii, Fujisawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/254,392

(22) PCT Filed: Jul. 15, 1998

(86) PCT No.: PCT/JP98/03180

§ 371 Date: Mar. 8, 1999

§ 102(e) Date: Mar. 8, 1999

(87) PCT Pub. No.: WO99/04504

PCT Pub. Date: Jan. 28, 1999

(30) Foreign Application Priority Data

Jul. 15, 1997 (JP) ............................................. 9-189726

(51) Int. Cl.[7] ................................................ H04B 1/38
(52) U.S. Cl. ............................ 455/552; 455/76; 455/84; 455/86; 455/209
(58) Field of Search .............................. 455/76, 86, 78, 455/84, 575, 552, 553, 31, 209

(56) References Cited

U.S. PATENT DOCUMENTS

| 5,732,330 | A | * | 3/1998 | Anderson et al. | 455/76 |
| 5,852,784 | A | * | 12/1998 | Ito et al. | 455/552 |
| 5,898,562 | A | * | 4/1999 | Heinonen | 455/76 |
| 5,953,641 | A | * | 9/1999 | Auvray | 455/74 |

FOREIGN PATENT DOCUMENTS

| JP | 5-75495 | 3/1993 |
| JP | 5-65137 | 8/1993 |
| JP | 9-130291 | 5/1997 |

* cited by examiner

Primary Examiner—Daniel Hunter
Assistant Examiner—Lana Le
(74) Attorney, Agent, or Firm—Finnegan, Henderson, Farabow, Garrett & Dunner, L.L.P.

(57) ABSTRACT

In radiocommunication apparatus, two downconverters (41, 42) for use in reception system each heterodyne their respective received RF signal to an intermediate frequency. One of the downconverters employs a local signal generated by a synthesizer (19), and the other employs a signal obtained by dividing the frequency of the local signal by a factor of N. Two upconverters (161, 162) for use in transmission system each convert their respective input transmit signal to a transmit RF signal. One of the upconverters employs a local signal generated by the synthesizer (19) and the other employs a signal obtained by dividing the frequency of the local signal by a factor of N.

5 Claims, 5 Drawing Sheets

RADIO COMMUNICATION EQUIPMENT

TECHNICAL FIELD

The present invention relates to radiocommunication apparatus which makes communication selectively using one of frequency bands respectively allocated to two communication systems such as GSM (Global system for Mobile Telecommunications) 900 and DCS (Digital Cellular System) 1800.

BACKGROUND ART

As is well known, there is radiocommunication apparatus that is capable of making communication selectively using one of frequency bands respectively allocated to two communication systems. FIG. 7 shows a basic arrangement of this type of radiocommunication apparatus. The conventional radiocommunication apparatus will be described below with reference to FIG. 7.

An antenna 1 is one that is capable of transmitting and receiving signals in frequency bands A and B (hereinafter referred simply as to bands A and B) which are allocated to two radiocommunication systems, respectively.

Signals received by the antenna 1 is divided in an antenna duplexer 2. The received signal in the band A is applied to a low-noise amplifier 31, while the received signal in the band B is applied to a low-noise amplifier 32.

The received signal in the band A, after being amplified by the low-noise amplifier 31, is mixed in a first downconverter 41 with a first local signal (local oscillator signal) generated by a first frequency synthesizer 18, so that it is heterodyned to an intermediate frequency (IF).

The frequency-converted received signal in the band A is applied as a first received IF signal to a first input terminal of a switch 5.

Likewise, the received signal in the band B, after being amplified by the low-noise amplifier 32, is mixed in a second downconverter 42 with a second local signal (local oscillator signal) generated by a second frequency synthesizer 19, so that it is heterodyned to an intermediate frequency. The frequency-converted received signal in the band B is applied as a second received IF signal to a second input terminal of the switch 5.

The frequencies of the first and second local signals are adjusted so that the received signals in the bands A and B are heterodyned to the same intermediate frequency.

The switch 5, as instructed by a controller not shown, selectively feeds the first received IF signal applied to the first input terminal or the second received IF signal applied to the second input terminal to a bandpass filter 6.

The bandpass filter 6 limits the bandwidth of the input IF signal to remove noise components outside of its passband.

The band-limited IF signal is amplified in an amplifier 7 up to a level appropriate for subsequent demodulation and then demodulated in a demodulator 8. The demodulated signal is applied through a signal output terminal 10 to succeeding signal processor (not shown).

The demodulator 8 employs a continuous wave (CW) signal generated by an oscillator 9 to regenerate the intermediate frequency.

In a modulator 12, the CW signal generated by the oscillator 9 is modulated with a modulating signal supplied from the signal processor via a signal input terminal 11, producing a transmit IF signal.

The transmit IF signal, after being amplified by an amplifier 13 up to an appropriate level, is applied to a lowpass filter 14 where noise and harmonic components unwanted for transmission are removed and then applied to a switch 15.

The switch 15, controlled by the controller not shown, selectively inputs the transmit IF signal to either a first upconverter 161 or a second upconverter 162.

The first upconverter 161 mixes the transmit IF signal with a first local signal generated by the first frequency synthesizer 18 for conversion to a radiofrequency signal in the band A.

The radiofrequency signal in the band A is amplified by a first power amplifier 171 and then radiated into space through the antenna duplexer 2 and the antenna 1.

The second upconverter 162 mixes the transmit IF signal with a second local signal generated by the second frequency synthesizer 19 for conversion to a radiofrequency signal in the band B.

The radiofrequency signal in the band B is amplified by a second power amplifier 172 for radiation into space through the antenna duplexer 2 and the antenna 1.

The local signals generated by the first and second frequency synthesizers 18 and 19 have their respective frequencies set to ones required for frequency conversion of the transmit IF signal to the radiofrequency signals in the bands A and B.

The conventional radiocommunication apparatus thus arranged permits the band A or B to be used selectively for communication by means of switching control of the switches 5 and 15.

The radiocommunication apparatus, if it is a mobile, may monitor the communication quality of one of the bands to prepare for hand-over during communication on the other band or monitor the communication quality of each of the bands when it is on standby for communication.

In receiving signals in two bands, it is a general practice to switch quickly to a band which is an object of reception. In switching between receiving bands quickly, in order to avoid the effect of insufficient startup of the frequency synthesizers (18 and 19 in FIG. 7), it is required to preoperate the frequency synthesizer associated with the band whose quality is to be monitored in addition to the frequency synthesizer associated with the band that is in use or operate the two frequency synthesizers from the beginning.

However, operating the two frequency synthesizers results in an increase in power dissipation. In particular, this is a serious problem for mobiles subject to constraints in continuous operating time. This problem likewise arises in the case where each of two transmission systems has its corresponding frequency synthesizer.

In addition, this problem is existent not only in such single superheterodyne radiocommunicatior apparatus as shown in FIG. 7 but also in double superheterodyne radiocommunication apparatus or TDD (Time Division Duplex)-based radiocommunication apparatus that is equipped with two frequency synthesizers for simultaneous reception of signals in two bands.

DISCLOSURE OF INVENTION

It is an object of the present invention to provide radiocommunication apparatus which permits two receiving systems to be operated simultaneously or to be switched at a high speed without any increase in power dissipation of frequency synthesizers.

To attain the object, the radiocommunication apparatus of the present invention heterodynes a received RF signal in a first frequency band allocated for a first radiocommunication system to an intermediate frequency using a signal obtained by dividing the frequency of a local oscillator signal by a factor of N and heterodynes a received RF signal in a second frequency band allocated for a second radiocommunication system to an intermediate frequency using the local oscillator signal. That is, received signals in the two frequency bands allocated for the two radiocommunication systems are heterodyned using local signals generated from a single local oscillator.

Accordingly, according to this radiocommunication apparatus, the use of only one local oscillator allows the reception (transmission) of signals in two bands while switching therebetween at high speed or the simultaneous reception (transmission) thereof without any increase in power dissipation.

Moreover, to attain the object, in the radiocommunication apparatus of the present invention, a first local oscillator signal is generated by a local oscillator and a second local oscillator signal is generated by multiplying the frequency of the first local oscillator signal by a factor of N (N>0). A received signal in a first frequency band allocated for a first radiocommunication system is heterodyned using the first local oscillator signal and a received signal in a second first frequency band allocated for a second radiocommunication system is heterodyned using the second local oscillator signal. That is, the received signals in the two frequency bands allocated for the two radiocommunication systems are heterodyned using local signals generated from a single local oscillator.

Accordingly, according to this radiocommunication apparatus, the use of only one local oscillator allows the reception (transmission) of signals in two bands while switching therebetween at high speed or the simultaneous reception (transmission) thereof without any increase in power dissipation.

BEST MODE OF CARRYING OUT THE INVENTION

Figure 1:
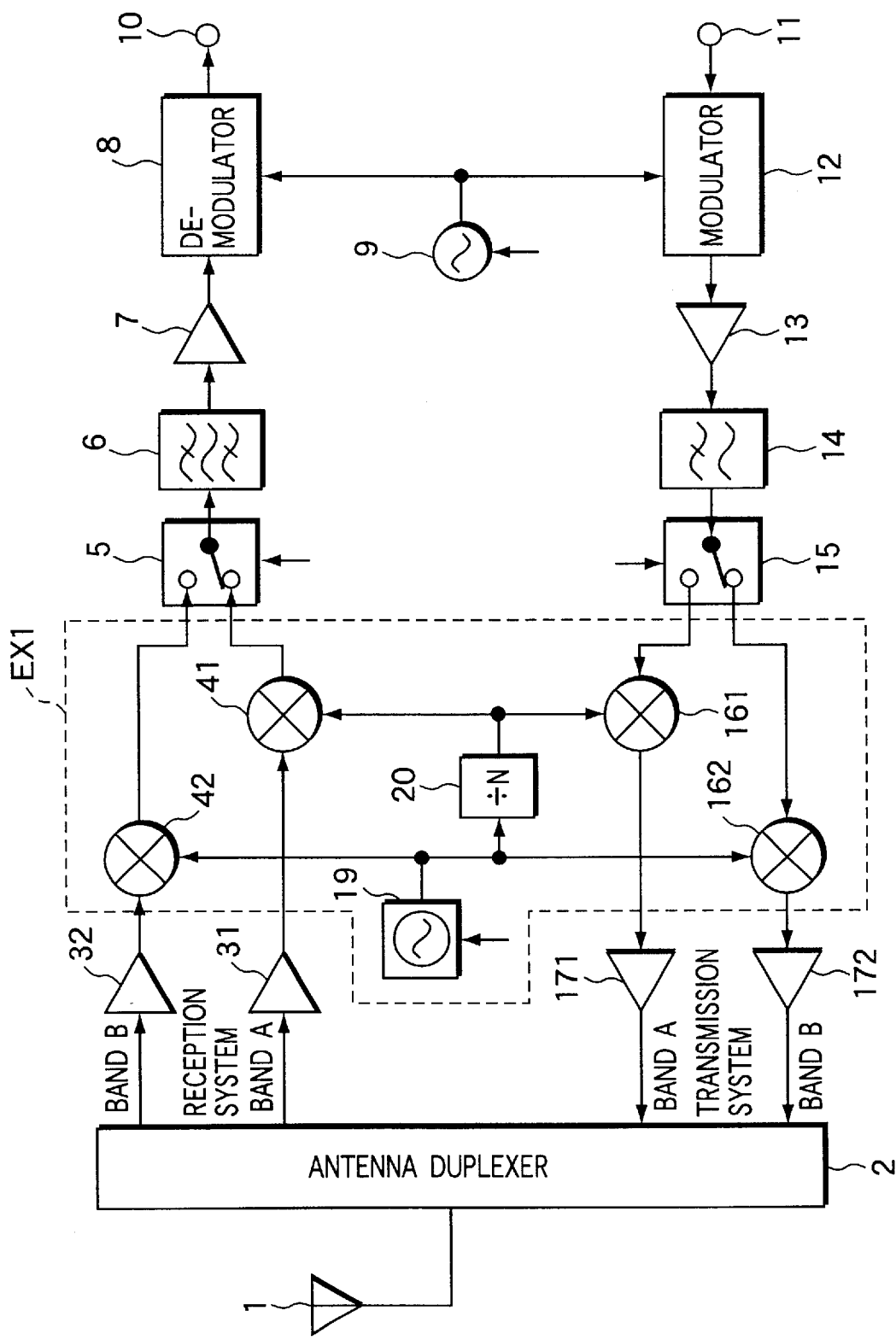
FIG. 1 is a block diagram of radiocommunication apparatus according to an embodiment of the present invention.

Referring now to FIG. 1, there is shown an arrangement of radiocommunication apparatus according to an embodiment of the present invention. In this figure, like reference numerals are used to denote corresponding components to those in FIG. 1.

Figures 3, 4:
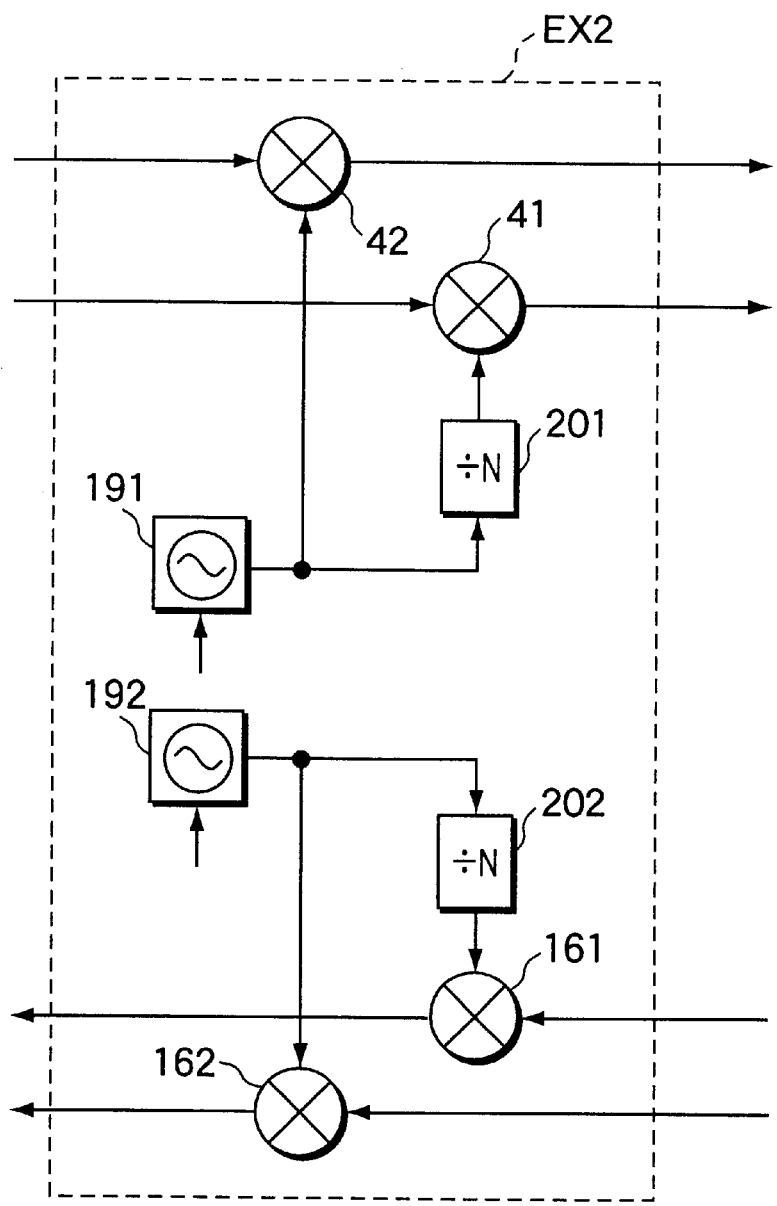
FIG. 3 is a diagram for use in explanation of two frequency bands that the antenna of the radiocommunication apparatus shown in FIG. 1 can transmits and receives.
FIG. 4 is a block diagram of a modified version of the frequency converter EX1 of the radiocommunication apparatus shown in FIG. 1.

An antenna 1 is one that, as shown in FIG. 3, is capable of transmitting and receiving signals in frequency bands (bands A and B) which are allocated to two radiocommunication systems, respectively.

Signals in the two frequency bands received by the antenna 1 is divided in an antenna duplexer 2. The received signal in the band A is applied to a low-noise amplifier 31, while the received signal in the band B is applied to a low-noise amplifier 32.

The received signal in the band A is amplified by the low-noise amplifier 31, while the signal in the band B is amplified by the low-noise amplifier 32. The amplified received signals in the bands A and B are both applied to a frequency converter EX1. The frequency converter EX1 comprises first and second downconverters 41 and 42 as downconverters for use in reception system, first and second upconverters 161 and 162 as upconverters for use in transmission system, a frequency synthesizer 19, and a divide-by-N frequency divider (÷N) 20.

The synthesizer 19 generates a local signal (local oscillator signal) of a frequency specified by a controller not shown. The local signal is then applied to the second downconverter 42, the second upconverter 162, and the divide-by-N frequency divider 20.

The divide-by-N frequency divider 20 divides the frequency of the local signal generated by the frequency synthesizer by a factor of N (>0) and applies its output signal to the first downconverter 41 and the first upconverter 161.

The first downconverter 41 mixes the received signal in band A amplified by the low-noise amplifier 31 with the local signal having its frequency divided by the frequency divider 20 to produce a first received intermediate-frequency (IF) signal, which, in turn, is applied to a first input of a switch 5.

The second downconverter 42 mixes the received signal in band B amplified by the low-noise amplifier 32 with the local signal generated by the frequency synthesizer 19 to produce a second received intermediate-frequency (IF) signal, which, in turn, is applied to a second input of the switch 5.

The switch 5, under the control of a controller not shown, makes a choice from the signal applied to the first input terminal and the signal applied to the second input terminal, i.e., the first received IF signal and the second received IF signal, and applies it to a bandpass filter 6.

The bandpass filter 6 limits the band of an input IF signal to remove noise components outside of its passband.

The band-limited received IF signal is amplified by an amplifier 7 up to a level appropriate for subsequent demodulation, then demodulated by a demodulator 8 and applied to a succeeding signal processor (not shown).

The demodulator 8 regenerates the intermediate frequency using a CW signal generated by an oscillator 9.

In a modulator 12, the CW signal generated by the oscillator 9 is modulated with a modulating signal supplied from the signal processor via a signal input terminal 11, producing a transmit IF signal.

The transmit IF signal, after being amplified by an amplifier 13 up to an appropriate level, is applied to a lowpass filter 14 where noise and harmonic components unwanted for transmission are removed and then applied to a switch 15.

The switch 15, controlled by the controller not shown according to a frequency band on which the transmit IF signal is to be transmitted, selectively inputs the transmit IF signal to the first upconverter 161 or the second upconverter 162.

The first upconverter 161 mixes the local signal having its frequency divided by N by the frequency divider 20 with the transmit IF signal to convert that IF signal to a radiofrequency signal in band A. The resulting radiofrequency signal is applied to a first power amplifier 171 as a first transmit RF signal.

Likewise, the second upconverter 162 mixes the local signal generated by the frequency synthesizer 19 with the transmit IF signal to convert this IF signal to a radiofrequency signal in band B. The resulting radiofrequency signal is applied to a second power amplifier 172 as a second transmit RF signal.

The first and second transmit RF signals are power amplified by the first and second power amplifiers 171 and 172, respectively, and then radiated into space through the antenna duplexer 2 and the antenna 1.

In the radiocommunication apparatus thus arranged, the local signal generated by the frequency synthesizer and the signal whose frequency is N times lower than the local signal frequency are applied to the two downconverters 41 and 42, respectively.

Accordingly, according to this radiocommunication apparatus, the use of only one frequency synthesizer allows the reception of signals in two bands while switching therebetween at high speed or the simultaneous reception thereof without any increase in power dissipation.

In addition, even in the transmission system, only one synthesizer can be used to transmit signals in the two bands while switching between them at high speed or transmit the signals simultaneously without any increase in power dissipation.

The above-described radiocommunication apparatus can be adapted to the GSM standard for cellular mobile communication set by the ETSI (European Telecommunications Standards Institute).

The GSM standard employs two frequency bands which are respectively used in two systems referred to as GSM 900 (Global System for Mobile communications at 900 MHz) and DCS 1800 (Digital Cellular System at 1800 MHz). In this invention, the band A is assumed. to be the frequency band used in GSM 900 and the band B is assumed to be the frequency band used in DCS 1800.

In GSM 900, 70 MHz is allocated to the overall bandwidth. The 35 MHz bandwidth from 880 to 915 MHz is allocated for transmission, and the 35 MHz bandwidth from 925 to 960 MHz is allocated for reception.

In DCS 1800, 150 MHz is allocated to the overall bandwidth. The 75 MHz bandwidth from 1710 to 1785 MHz is used for transmission and the 75 MHz bandwidth is used for reception.

In both GSM 900 and DCS. 1800, the carrier frequencies are separated by 200 KHz.

FIGS. 2A, 2B, 2C and 2D show relationships among the frequency bands allocated to GSM 900 and DCS 1800 and the frequencies of locally generated signals. Hereinafter, description is given taking the relationship shown in FIG. 2D by way of example.

Figures 2A, 2B, 2C, 2D:
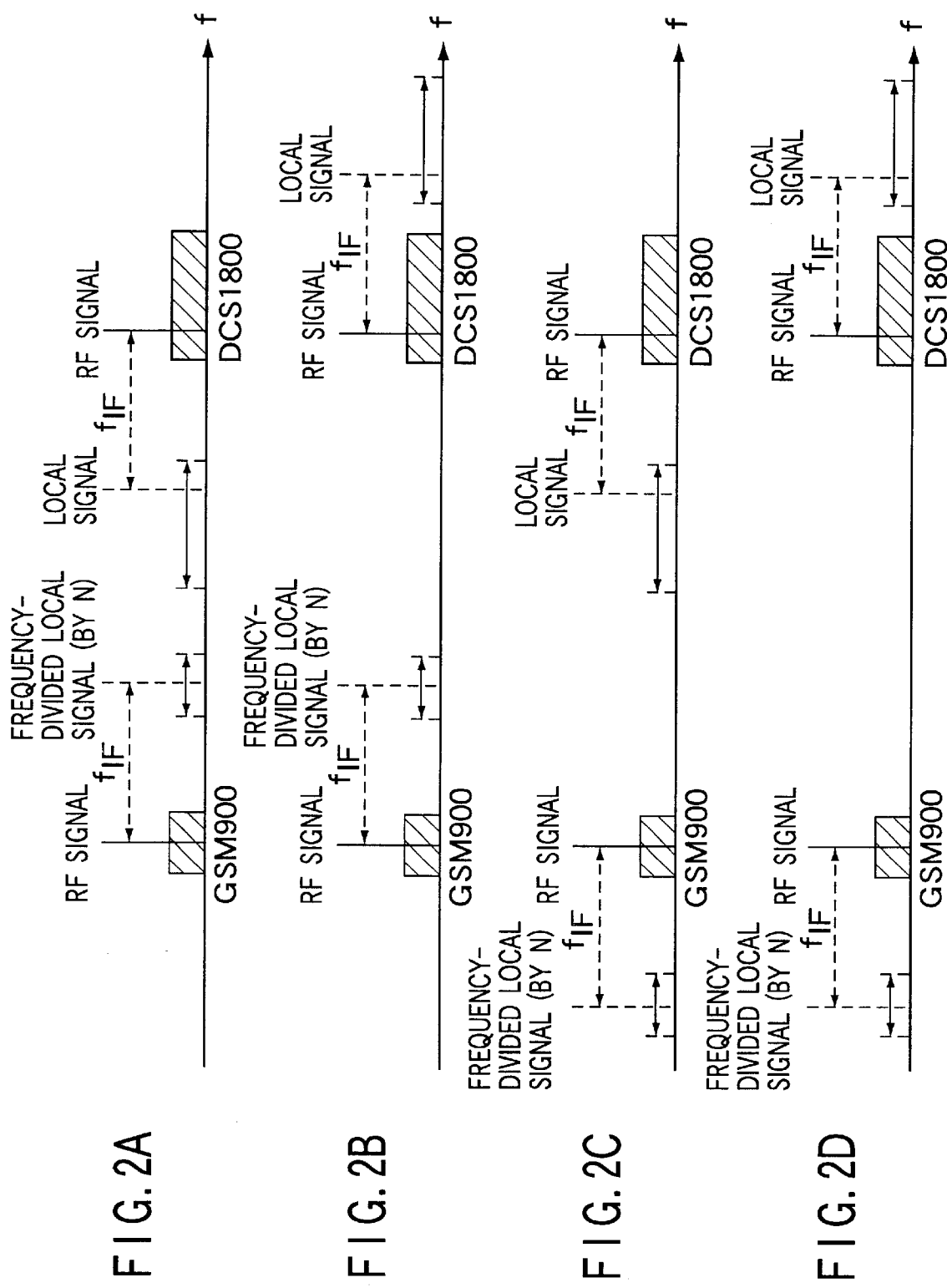
FIGS. 2A, 2B, 2C, and 2D show relationships among the frequency band of GSM 900, the frequency band of DCS 1800, and the frequencies of synthesizer-based local signals.

In FIG. 2D, the frequency of the local signal generated by the synthesizer 19 is set higher than the frequency band of DCS 1800 and the frequency of the output signal of the divide-by-N frequency divider is set lower than the frequency band of GSM 900.

Assume, for example, that the intermediate frequency fIF at the time of transmission/reception in both DCS 1800 and GSM 900 is 240 MHz and the dividing factor of the divide-by-N frequency divider 20 is 3 (i.e., N=3). Then, the frequency of the local signal generated by the frequency synthesizer 19 required at the time of transmission in DCS 1800 is in the range of $$1710+240 \text{ to } 1785+240=1950 \text{ to } 2025 \text{ MHz}$$

At the time of reception in DCS 1800, the frequency of the local signal generated by the frequency synthesizer 19 needs to be in the range of $$1805+240 \text{ to } 1880+240=2045 \text{ to } 2120 \text{ MHz}$$

On the other hand, the frequency of the local signal generated by the frequency synthesizer 19 required at the time of transmission in GSM 900 is in the range of $$\{(880-240) \text{ to } (915-240)\} \times 3 = 1920 \text{ to } 2025 \text{ MHz}$$

At the time of reception in DCS 1800, the frequency of the local signal generated by the frequency synthesizer 19 needs to be in the range of $$\{(925-240) \text{ to } (960-240)\} \times 3 = 2055 \text{ to } 2160 \text{ MHz}$$

Thus, in order to perform transmission and reception on the frequency bands of GSM 900 and DCS 1800 using the radiocommunication apparatus arranged as described above, it is necessary only that the local signal frequency generated by the synthesizer 19 be set in a range of 1920 to 2160 MHz.

In order to allow the frequency band of GSM 900, the frequency band of DCS 1800, and the local signal frequency generated by the frequency synthesizer 19 to have such a relationship as shown in FIG. 2A, 2B, or 2C instead of FIG. 2D, it is required to determine the intermediate frequency fIF and the dividing factor N of the frequency divider 20 in accordance with the following equations:

$$(a): (fA+fIF) \times N = fB - fIF$$

$$(b): (fA+fIF) \times N = fB + fIF$$

$$(c): (fA-fIF) \times N = fB - fIF$$

where fA is a frequency in the frequency band A (GSM 900) and fB is a frequency in the frequency band B (DCS 1800).

The present invention is not limited to the above embodiment.

For example, at the time of communication by GSM 900, the local frequency generated by the frequency synthesizer 19 needs to be in the range of 1920 to 2160 MHz. On the other hand, at the time of communication by DCS 1800, the local frequency needs to be in the range of 1950 to 2120 MHz.

In view of this point, the frequency range of the local signal generated by the frequency synthesizer 19 at the time of communication by GSM 900 can be narrowed by controlling the oscillator 9 with the controller not shown so as to make its oscillation frequency higher at the time of transmission by GSM 900 and lower at the time of reception by GSM 900.

The frequency conversion unit EX1 shown in FIG. 1 can be replaced with such a frequency conversion unit EX2 as shown in FIG. 4.

The frequency conversion unit EX2 is arranged such that the transmission system is provided with first and second downconverters 41 and 42, a frequency synthesizer 191, and a divide-by-N frequency divider 201 and the reception system has first and second upconverters 161 and 162, a frequency synthesizer 192, and a divide-by-N frequency divider 202.

The synthesizer 191 generates a local signal of a frequency specified by the controller not shown. This local signal is then applied to the second downconverter 42 and the frequency divider 201.

The frequency divider 201 divides the frequency of the local signal (local oscillator signal) generated by the frequency synthesizer 191 by a factor of N. The resulting frequency-divided signal is then applied to the first downconverter 41.

The first downconverter 41 mixes a received signal in the frequency band A amplified in the amplifier 31 with the frequency-divided local signal from the frequency divider 201 to produce a first received IF signal. This IF signal is then applied to the first input terminal of the switch 5.

Likewise, the second downconverter 42 mixes a received signal in the frequency band B amplified in the amplifier 32 with the local signal generated from the frequency synthesizer 191 to produce a second received IF signal. This IF signal is then applied to the second input terminal of the switch 5.

On the other hand, the synthesizer 192 generates a local signal of a frequency specified by the controller not shown. This local signal is then applied to the second upconverter 162 and the frequency divider 202.

The frequency divider 202 divides the frequency of the local signal (local oscillator signal) generated by the frequency synthesizer 192 by a factor of N. The resulting frequency-divided signal is applied to the first upconverter 161.

The first upconverter 161 mixes a transmit IF signal supplied through the switch 15 with the frequency-divided local signal from the frequency divider 202 to produce a radiofrequency signal in the frequency band A. The resulting RF signal is then applied to the first power amplifier 171 as a first transmit RF signal.

Likewise, the second upconverter 162 mixes a transmit IF signal supplied through the switch 15 with the local signal generated from the frequency synthesizer 192 to produce a radiofrequency signal in the frequency band B. The resulting RF signal is then applied to the second power amplifier 172 as a second transmit RF signal.

As described above, the radiocommunication apparatus having the frequency conversion unit EX2 uses a separate synthesizer for each of transmission and reception to generate local signals, allowing each of reception and transmission to be performed independently.

Accordingly, according to this radiocommunication apparatus having the frequency conversion unit EX2, the use of only one frequency synthesizer allows the reception of signals in two bands while switching therebetween at high speed or the simultaneous reception thereof without any increase in power dissipation. In addition, since only the reception system can be operated, power dissipation during the waiting time can be reduced.

Moreover, even in the transmission system, only one synthesizer can be used to transmit signals in the two bands while switching between them at high speed or transmit the signals simultaneously without any increase in power dissipation.

Figure 5:
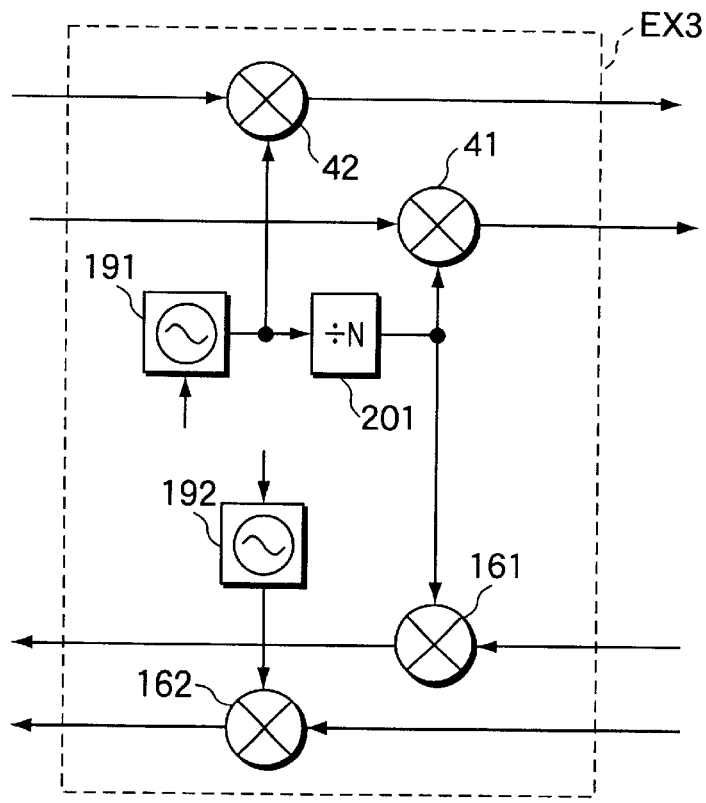
FIG. 5 is a block diagram of another modified version of the frequency converter EX1 of the radiocommunication apparatus shown in FIG. 1.

Further, the frequency conversion unit EX1 shown in FIG. 1 may be replaced with such a frequency conversion unit EX3 as shown in FIG. 5.

The frequency conversion unit EX3 is equipped with first and second converters 41 and 42, a frequency synthesizer 191, a divide-by-N frequency divider 201, first and second upconverters 161 and 162, and a frequency synthesizer 192.

The synthesizer 191 generates a local signal of a frequency specified by the controller not shown. This local signal is then applied to the second downconverter 42 and the frequency divider 201.

The frequency divider 201 divides the frequency of the local signal (local oscillator signal) generated by the frequency synthesizer 191 by a factor of N. The resulting frequency-divided signal is then applied to the first downconverter 41 and the first upconverter 161.

The first downconverter 41 mixes a received signal in the frequency band A amplified in the amplifier 31 with the frequency-divided local signal from the frequency divider 201 to produce a first received IF signal. This IF signal is then applied to the first input terminal of the switch 5.

Likewise, the second downconverter 42 mixes a received signal in the frequency band B amplified in the amplifier 32 with the local signal generated from the frequency synthesizer 191 to produce a second received IF signal. This IF signal is applied to the second input terminal of the switch 5.

On the other hand, the synthesizer 192 generates a local signal of a frequency specified by the controller not shown. This local signal is then applied to the second upconverter 162.

The first upconverter 161 mixes a transmit IF signal supplied through the switch 15 with the frequency-divided local signal from the frequency divider 201 to produce a radiofrequency signal in the frequency band A. The resulting RF signal is then applied to the first power amplifier 171 as a first transmit RF signal.

The second upconverter 162 mixes a transmit IF signal supplied through the switch 15 with the local signal generated from the frequency synthesizer 192 to produce a radiofrequency signal in the frequency band B. The resulting RF signal is then applied to the second power amplifier 172 as a second transmit RF signal.

As described above, the radiocommunication apparatus having the frequency conversion unit EX3 uses the same frequency synthesizer for reception and transmission. on the frequency band A.

Thus, the radiocommunication apparatus thus arranged allows switching between the two frequency bands during communication on one frequency band for reception on. the other band through the use of a single synthesizer. This thus allows reception on the two frequency bands without increasing power dissipation.

Figure 6:
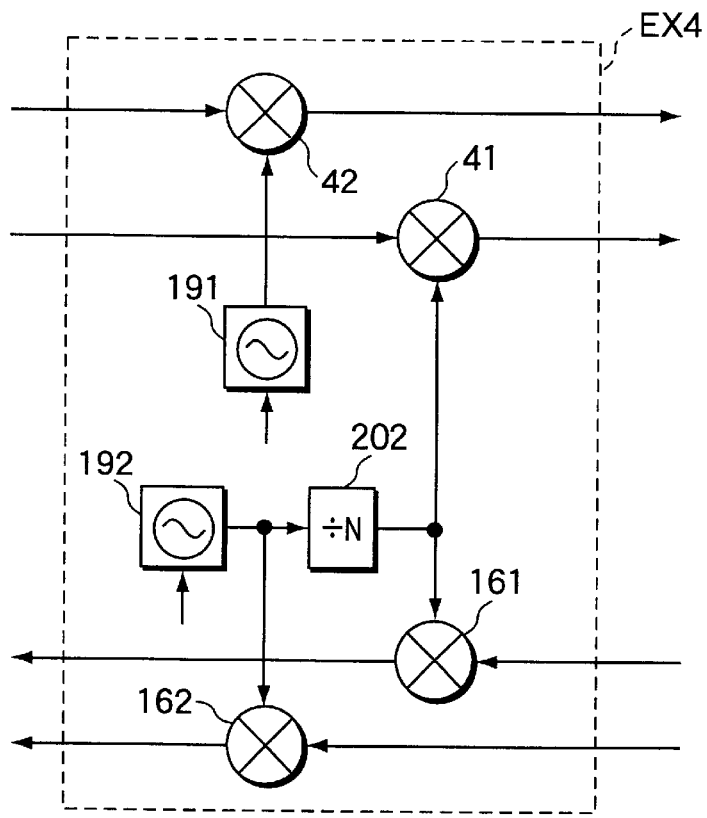
FIG. 6 is a block diagram of still another modified version of the frequency converter EX1 of the radiocommunication apparatus shown in FIG. 1.
Figure 7:
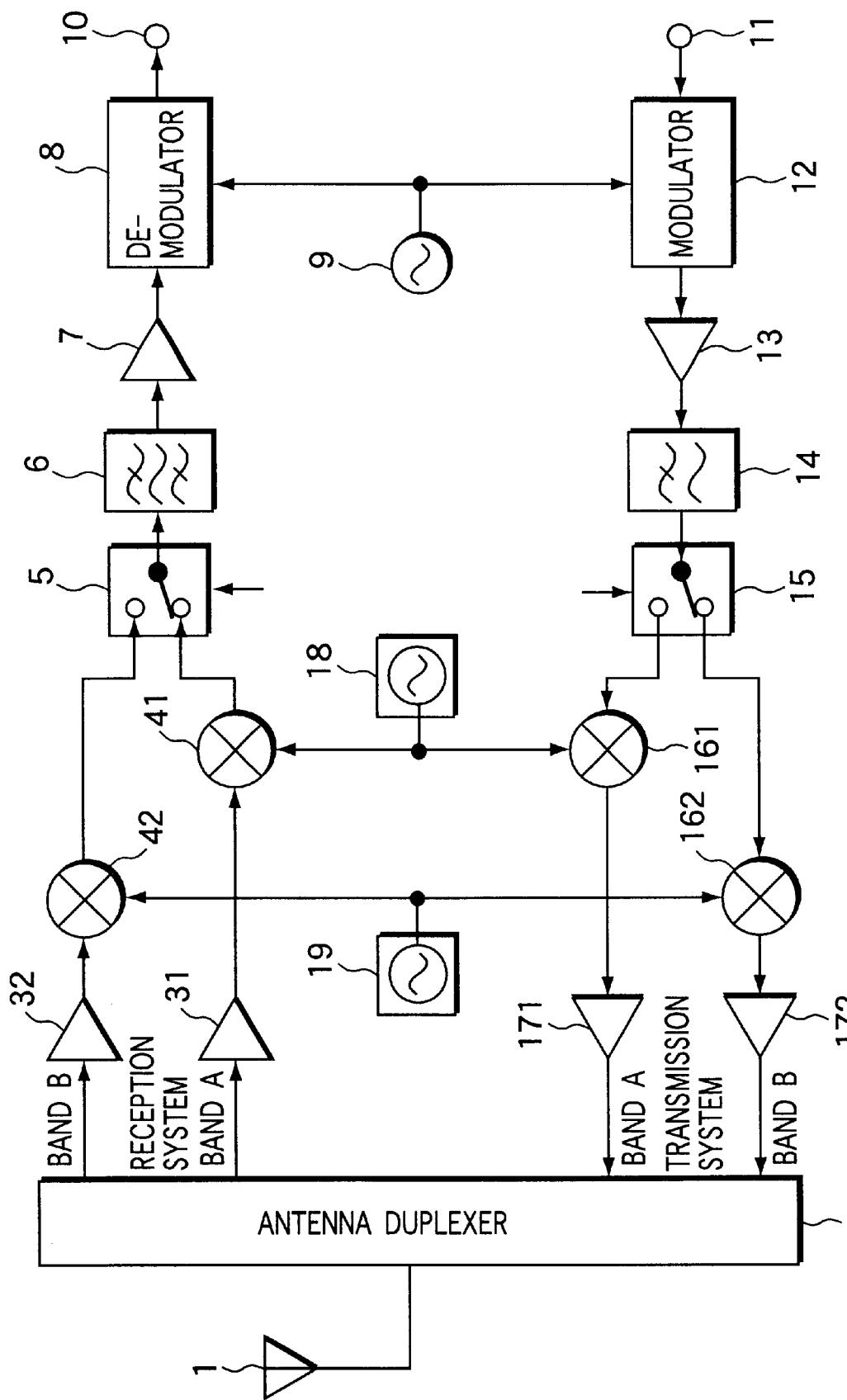
FIG. 7 is a block diagram of conventional radiocommunication apparatus.

Furthermore, the frequency conversion unit EX1 shown in FIG. 1 may be replaced with such a frequency conversion unit EX4 as shown in FIG. 6.

The frequency conversion unit EX4 is equipped with first and second downconverters 41 and 42, a frequency synthesizer 191, a divide-by-N frequency divider (÷N) 202, first and second upconverters 161 and 162, and a frequency synthesizer 192.

The synthesizer 191 generates a local signal of a frequency specified by the controller not shown. This local signal is then applied to the second downconverter 42.

On the other hand, the synthesizer 192 generates a local signal of a frequency specified by the controller not shown. This local signal is then applied to the second upconverter 162 and the frequency divider 202.

The frequency divider 202 divides the frequency of the local signal generated by the frequency synthesizer 192 by a factor of N (>0). The resulting frequency-divided signal is then applied to the first downconverter 41 and the first upconverter 161.

The first downconverter 41 mixes a received signal in the frequency band A amplified in the amplifier 31 with the frequency-divided local signal from the frequency divider 202 to produce a first received IF signal. This IF signal is applied to the first input terminal of the switch 5.

The second downconverter 42 mixes a received signal in the frequency band B amplified in the amplifier 32 with the local signal generated from the frequency synthesizer 191 to produce a second received IF signal. This IF signal is applied to the second input terminal of the switch 5.

The first upconverter 161 mixes a transmit IF signal supplied through the switch 15 with the frequency-divided local signal from the frequency divider 201 to produce a radiofrequency signal in the frequency band A. The resulting RF signal is then applied to the first power amplifier 171 as a first transmit RF signal.

The second upconverter 162 mixes a transmit IF signal supplied through the switch 15 with the local signal generated from the frequency synthesizer 192 to produce a radiofrequency signal in the frequency band B. The resulting RF signal is then applied to the second power amplifier 172 as a second transmit RF signal.

As described above, the radiocommunication apparatus having the frequency conversion unit EX3 uses the same frequency synthesizer for reception and transmission on the frequency band A.

Thus, the radiocommunication apparatus thus arranged allows switching between the two frequency bands during communication on one frequency band for reception on the other through the use of a single synthesizer. This thus allows reception on the two frequency bands without increasing power dissipation.

In the above embodiments, the dividing factor, N, of the frequency dividers 20, 201, and 202 may be any decimal fraction as long as it is positive. In other words, the frequency of the local signal may be multiplied by the frequency divider. This will provide the same advantage as in the case where the local signal frequency is divided.

The present invention may be practiced or embodied in still other ways without departing the scope and spirit thereof.

What is claimed is:

1. A radio communication apparatus which performs communication by selectively using at least one of a first frequency band and a second frequency band higher than the first frequency band, each frequency band respectively allocated for first and second radio communication systems, comprising:

local oscillator signal generating means for generating a local oscillator signal with an arbitrary frequency;

frequency dividing means for dividing the frequency of the local oscillator signal generated by the local oscillator signal generating means by a factor of N (N>0) to produce a frequency-divided local signal having a frequency outside the first and second frequency bands;

first frequency conversion means for converting a communication signal in the first frequency band using the frequency-divided local signal from the frequency dividing means, wherein the first frequency conversion means includes:

first down-conversion means for down-converting a first radio-frequency (RF) signal, received on the first frequency band, to a first intermediate-frequency (IF) signal using the frequency-divided local signal from the frequency dividing means; and first up-conversion means for up-converting a second IF signal, to be transmitted on the first frequency band, to a second RF signal using the frequency-divided local signal from the frequency dividing means; and second frequency conversion means for converting a communication signal in the second frequency band using the local oscillator signal from the local oscillator signal generating means, wherein the second frequency conversion means includes:

second down-conversion means for down-converting a third RF signal, received on the second frequency band, to a third IF signal using the local oscillator signal.

2. A radio communication apparatus which performs communication by selectively using at least one of a first frequency band and a second frequency band higher than the first frequency band, each frequency band respectively allocated for first and second radio communication systems, comprising:

local oscillator signal generating means for generating a local oscillator signal with an arbitrary frequency;

frequency dividing means for dividing the frequency of the local oscillator signal generated by the local oscillator signal generating means by a factor of N (N>0) to produce a frequency-divided local signal having a frequency outside the first and second frequency bands;

first frequency conversion means for converting a communication signal in the first frequency band using the frequency-divided local signal from the frequency dividing means, wherein the first frequency conversion means includes:

first down-conversion means for down-converting a first radio-frequency (RF) signal, received on the first frequency band, to a first intermediate-frequency (IF) signal using the frequency-divided local signal from the frequency dividing means; and first up-conversion means for up-converting a second IF signal, to be transmitted on the first frequency band, to a second RF signal using the frequency-divided local signal from the frequency dividing means; and second frequency conversion means for converting a communication signal in the second frequency band using the local oscillator signal from the local oscillator signal generating means, wherein the second frequency conversion means includes:

second up-conversion means for up-converting a fourth IF signal, to be transmitted on the second frequency band, to a fourth RF signal using the local oscillator signal.

3. A radio communication apparatus which performs communication by selectively using at least one of a first frequency band and a second frequency band higher than the first frequency band, each frequency band respectively allocated for first and second radio communication systems, comprising:

local oscillator signal generating means for generating a local oscillator signal with an arbitrary frequency;

frequency dividing means for dividing the frequency of the local oscillator signal generated by the local oscillator signal generating means by a factor of N (N>0) to produce a frequency-divided local signal having a frequency outside the first and second frequency bands;

first frequency conversion means for converting a communication signal in the first frequency band using the frequency-divided local signal from the frequency dividing means, wherein the first frequency conversion means includes:

first down-conversion means for down-converting a first radio-frequency (RF) signal, received on the first frequency band, to a first intermediate-frequency (IF) signal using the frequency-divided local signal from the frequency dividing means; and first up-conversion means for up-converting a second IF signal, to be transmitted on the first frequency band, to a second RF signal using the frequency-divided local signal from the frequency dividing means; and second frequency conversion means for converting a communication signal in the second frequency band using the local oscillator signal from the local oscillator signal generating means, wherein the second frequency conversion means includes:

second down-conversion means for down-converting a third RF signal, received on the second frequency band, to a third IF signal using the local oscillator signal; and second up-conversion means for up-converting a fourth IF signal, to be transmitted on the second frequency band, to a fourth RF signal using the local oscillator signal.

4. The radio communication apparatus according to any one of claims 1 through 3, wherein the frequency dividing means divides the frequency of the local oscillator signal generated by the local oscillator signal generating means by a factor of three to a frequency lower than the second frequency band.

5. The radio communication apparatus according to any one of claims 1 through 3, wherein the first IF signal obtained by the first down-conversion means and the third IF signal obtained by the second down-conversion means are equal to each other in frequency.

* * * * *